United States Patent
Rajauria et al.

(10) Patent No.: US 12,354,630 B1
(45) Date of Patent: Jul. 8, 2025

(54) REDUCING LASER DIODE TEMPERATURE SWINGS IN HEAT-ASSISTED MAGNETIC RECORDING (HAMR) USING A SLIDER-MOUNTED HEAT SINK

(71) Applicant: Western Digital Technologies, Inc., San Jose, CA (US)

(72) Inventors: Sukumar Rajauria, San Jose, CA (US); Xiaokun Chew, San Juan Capistrano, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/632,451

(22) Filed: Apr. 11, 2024

(51) Int. Cl.
| | |
|---|---|
| *G11B 5/48* | (2006.01) |
| *G11B 5/40* | (2006.01) |
| *G11B 33/14* | (2006.01) |
| *G11B 5/00* | (2006.01) |
| *H01S 5/024* | (2006.01) |

(52) U.S. Cl.
CPC ............ *G11B 5/40* (2013.01); *G11B 33/1426* (2013.01); *G11B 2005/0021* (2013.01); *H01S 5/02469* (2013.01)

(58) Field of Classification Search
None
See application file for complete search history.

(56) References Cited

U.S. PATENT DOCUMENTS

| | | | | |
|---|---|---|---|---|
| 6,038,203 | A * | 3/2000 | Tajiri | G11B 7/22 |
| 8,288,204 | B1 * | 10/2012 | Wang | H01L 21/6835 |
| | | | | 438/770 |
| 9,025,423 | B1 | 5/2015 | Naniwa et al. | |
| 9,177,585 | B1 * | 11/2015 | Seki | G11B 13/04 |
| 9,218,835 | B1 * | 12/2015 | Sasaki | G11B 5/4866 |
| 9,251,830 | B1 * | 2/2016 | Duda | G11B 5/3133 |
| 9,754,617 | B2 | 9/2017 | Cheng et al. | |
| 11,217,273 | B1 * | 1/2022 | Habibi | G11B 5/3163 |
| 2002/0041562 | A1 * | 4/2002 | Redmond | G11B 7/22 |
| 2004/0184367 | A1 * | 9/2004 | Lee | G11B 7/22 |
| 2006/0187564 | A1 * | 8/2006 | Sato | G11B 5/1278 |
| 2012/0092791 | A1 * | 4/2012 | Taguchi | G11B 5/6088 |
| | | | | 360/59 |
| 2013/0107680 | A1 * | 5/2013 | Contreras | G11B 5/40 |
| | | | | 369/13.32 |

* cited by examiner

*Primary Examiner* — Peter Vincent Agustin

(57) ABSTRACT

A heat-assisted magnetic recording apparatus may include a slider body, a submount, a laser diode assembly, and a first heat sink. The laser diode assembly comprises a plurality of lateral surfaces and a waveguide-facing surface. The submount is attached to the slider body by a first connector material. A first lateral surface of the laser diode assembly is in contact with the submount, and a second lateral surface of the laser diode assembly is in contact with the first heat sink. The first heat sink is in contact with a second connector material, which is in contact with the slider body to provide a heat flow path from the laser diode assembly to the slider body.

21 Claims, 12 Drawing Sheets

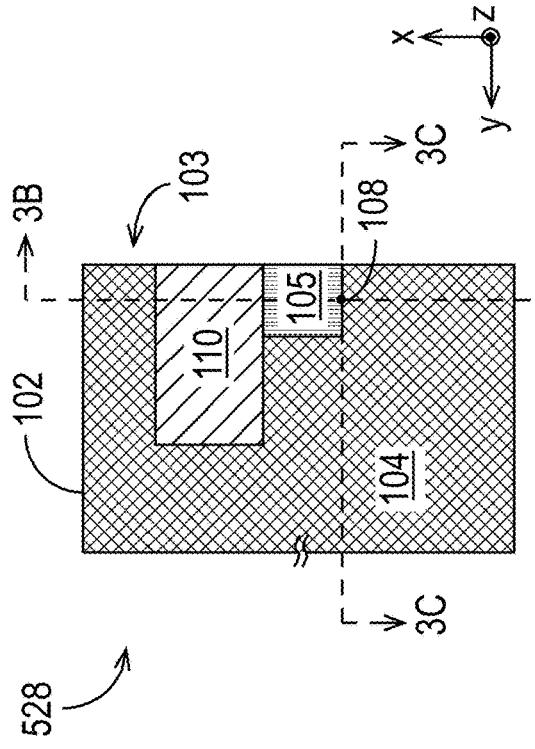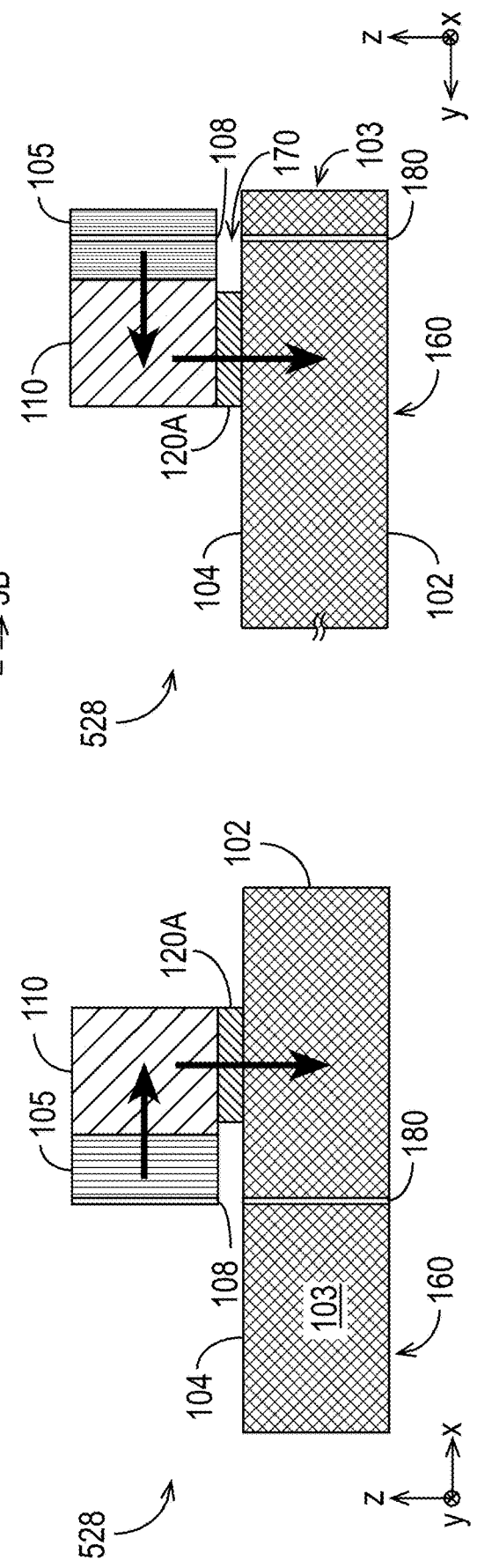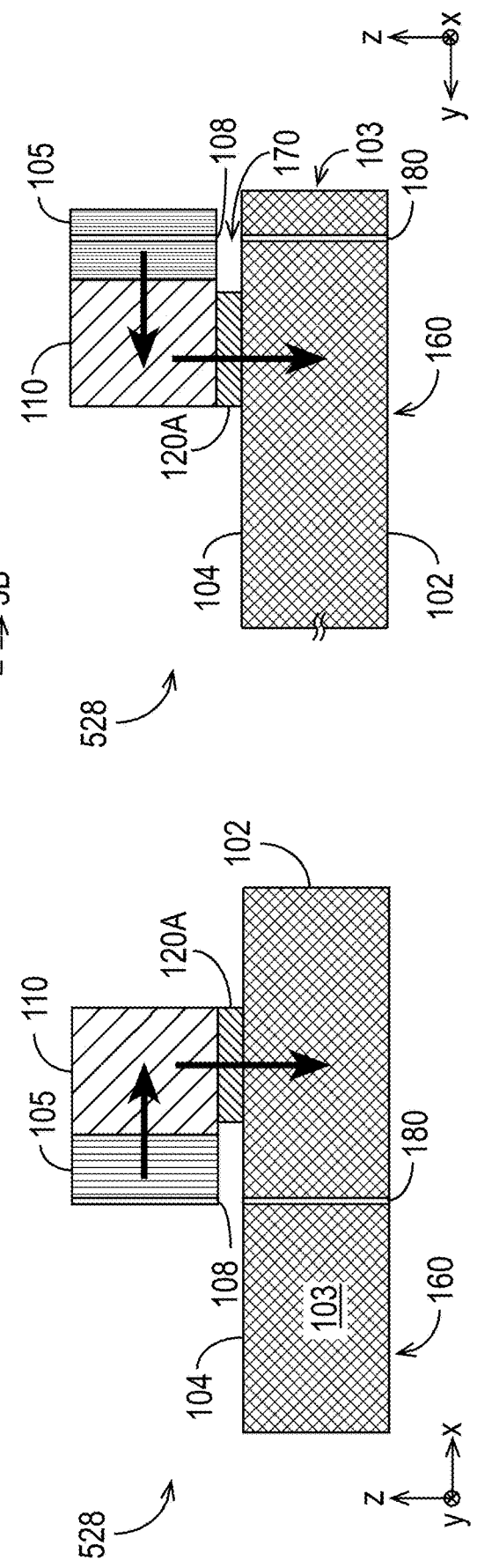

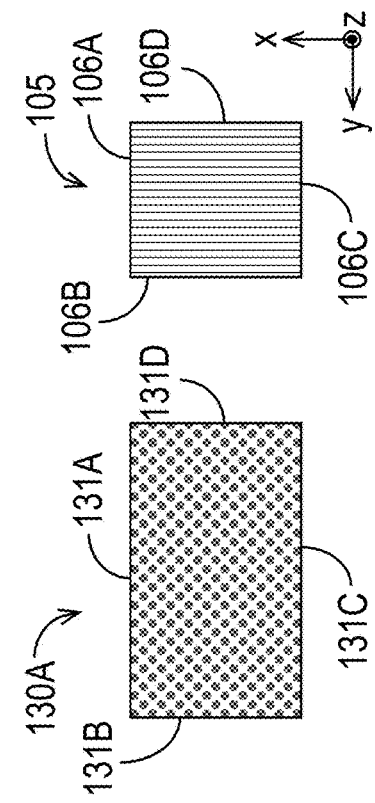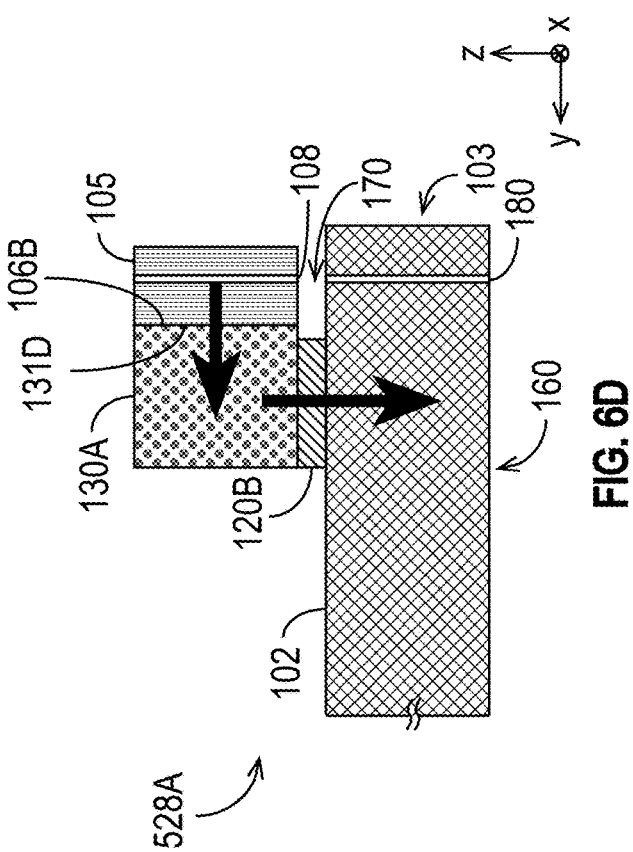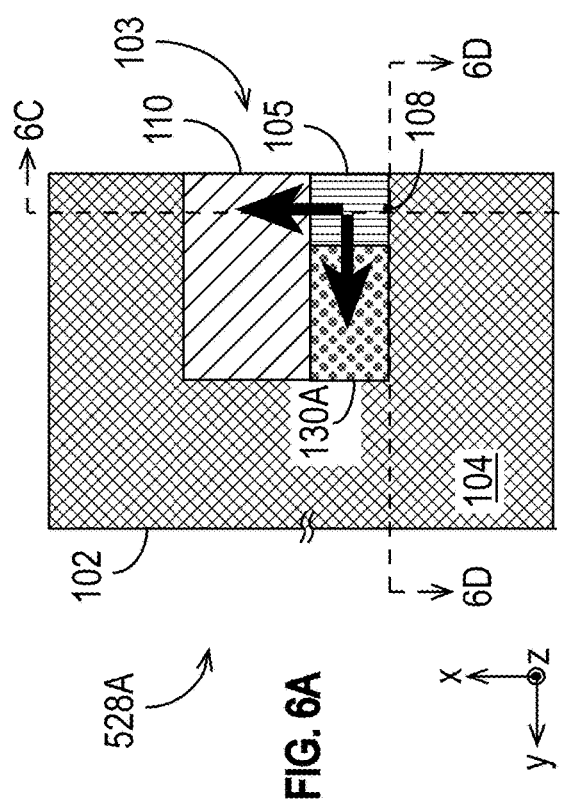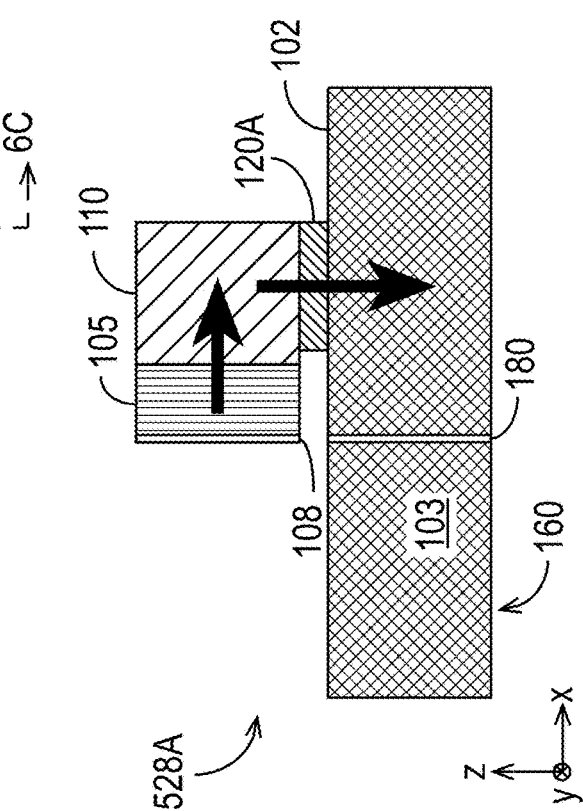

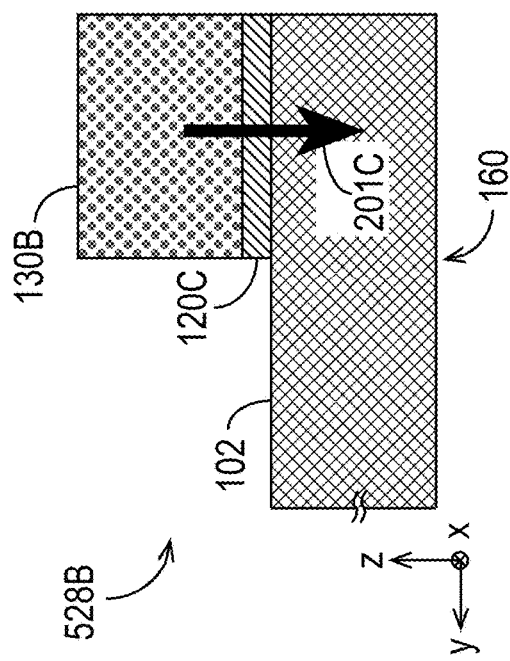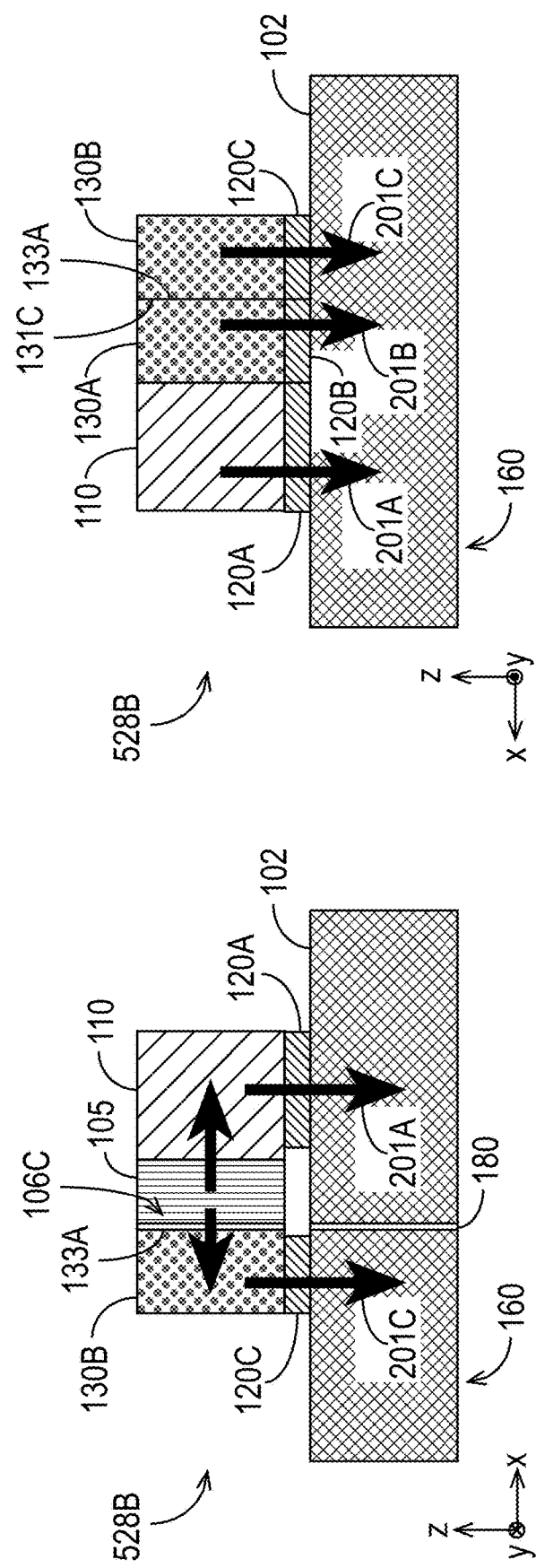

REDUCING LASER DIODE TEMPERATURE SWINGS IN HEAT-ASSISTED MAGNETIC RECORDING (HAMR) USING A SLIDER-MOUNTED HEAT SINK

BACKGROUND

A hard-disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read/write head that is positioned over a specific location of a disk by an actuator. A read/write head uses a magnetic field to read data from and write data to the surface of a magnetic-recording disk.

One of the ever-present objectives of hard disk drive design evolution is to increase areal density (a measure of the quantity of information bits that can be stored on a given area of disk surface), which has led to the development and implementation of various approaches for reducing the disk area needed to record a bit of information. It has been recognized that one significant challenge with minimizing bit size is due to the limitations imposed by the superparamagnetic effect whereby, in sufficiently small nanoparticles, the magnetization can randomly flip direction under the influence of thermal fluctuations.

Heat-assisted magnetic recording (HAMR), which may also be referred to as energy-assisted magnetic recording (EAMR) or thermal-assisted magnetic recording (TAR or TAMR), is a technology that magnetically records data on high-stability media using, for example, laser thermal assistance to heat the media material before writing to the media. (The term "HAMR" is used herein to refer to all of TAR, TAMR, EAMR, and HAMR.) HAMR takes advantage of high-stability, high coercivity magnetic compounds, such as iron platinum alloy, which can store single bits in a much smaller area without being limited by the same superparamagnetic effect that limits the current technology used in hard disk drive storage. At some capacity point, however, the bit size is so small and the coercivity correspondingly so high that the magnetic field used for writing data cannot be made strong enough to permanently affect the data, and data can no longer be written to the disk. HAMR solves this problem by temporarily and locally changing the coercivity of the magnetic storage medium by raising the temperature above the Curie temperature so that the medium effectively loses coercivity, and a realistically achievable magnetic write field can write data to the media.

Many HAMR systems use a light source, such as a laser diode, to change the local coercivity of the magnetic storage medium. To provide stability and accuracy in data writing operations, it is desirable for the light source in a HAMR system to be stable and predictable in its operation.

SUMMARY

This summary represents non-limiting embodiments of the disclosure.

Described herein are embodiments that relate generally to hard disk drives and more particularly to improving the heat dissipation associated with a laser for a heat-assisted magnetic recording (HAMR) head. Embodiments described herein include HAMR apparatuses that include at least one slider-mounted heat sink, and data storage devices that include such HAMR apparatuses and a magnetic storage medium.

In some aspects, the techniques described herein relate to a HAMR apparatus for writing to a magnetic storage media, the HAMR apparatus including: a slider body; a submount; a laser diode assembly including a plurality of lateral surfaces and a waveguide-facing surface; and a first heat sink. In some embodiments, the submount is attached to the slider body by a first connector material; a first lateral surface of the laser diode assembly is mounted to the submount; a second lateral surface of the laser diode assembly is in contact with a first lateral surface of the first heat sink; the first heat sink is in contact with a second connector material; and the second connector material is in contact with the slider body.

In some aspects, the first heat sink is substantially cuboid.

In some aspects, an area of the first lateral surface of the first heat sink is greater than or equal to an area of the second lateral surface of the laser diode assembly.

In some aspects, the first lateral surface of the first heat sink is in contact with an entirety of the second lateral surface of the laser diode assembly.

In some aspects, a thermal conductivity of the first heat sink is greater than or equal to a thermal conductivity of the laser diode assembly.

In some aspects, a thermal conductivity of the first heat sink is greater than a thermal conductivity of the submount.

In some aspects, the HAMR apparatus further includes a second heat sink, wherein a third lateral surface of the laser diode assembly is in contact with a first lateral surface of the second heat sink, the second heat sink is in contact with a third connector material, and the third connector material is in in contact with the slider body.

In some aspects, the second heat sink is substantially cuboid.

In some aspects, the techniques described herein relate to a HAMR apparatus, wherein an area of the first lateral surface of the second heat sink is greater than or equal to an area of the third lateral surface of the laser diode assembly.

In some aspects, the first lateral surface of the first heat sink is in contact with an entirety of the second lateral surface of the laser diode assembly.

In some aspects, the first lateral surface of the second heat sink is in contact with a second surface of the first heat sink.

In some aspects, the techniques described herein relate to a method of directing heat away from a laser diode assembly of a HAMR device, the method including: providing a first heat path from the laser diode assembly, the first heat path directing heat from a first lateral surface of the laser diode assembly through a submount, through a first connector material, and to a slider body; and providing a second heat path from the laser diode assembly, the second heat path directing the heat from a second lateral surface of the laser diode assembly through a first heat sink, through a second connector material, and to the slider body.

In some aspects, the method further includes selecting at least one dimension of the first heat sink based at least in part on a dimension of the laser diode assembly.

In some aspects, the method further includes selecting a material of the first heat sink based at least in part on a thermal conductivity of the material of the first heat sink.

In some aspects, a thermal conductivity of the first heat sink is greater than a thermal conductivity of the submount.

In some aspects, a thermal conductivity of at least a portion of the first heat path or the second heat path is greater than or equal to a thermal conductivity of the laser diode assembly.

In some aspects, the method further includes providing a third heat path from the laser diode assembly, the third heat path directing the heat from a third lateral surface of the laser diode assembly through a second heat sink, through a third connector material, and to the slider body.

In some aspects, the method further includes selecting at least one of the second connector material, the third connector material, a material of the first heat sink, or a material of the second heat sink based at least in part on a conductivity of the second connector material, the third connector material, the material of the first heat sink, or the material of the second heat sink.

In some aspects, the techniques described herein relate to a HAMR data storage device, including: means for attaching a laser diode assembly to a slider body; and means for providing a heat sinking path directly from the laser diode assembly to the slider body, wherein at least a portion of the heat sinking path is distinct from the means for attaching the laser diode assembly to the slider body.

In some aspects, the techniques described herein relate to a HAMR data storage device, wherein the heat sinking path is a first heat sinking path, and further including: means for providing a second heat sinking path directly from the laser diode assembly to the slider body, wherein at least a portion of the second heat sinking path is distinct from the first heat sinking path.

BRIEF DESCRIPTION OF THE DRAWINGS

Objects, features, and advantages of the disclosure will be readily apparent from the following description of certain embodiments taken in conjunction with the accompanying drawings in which:

FIGS. 3A, 3B, and 3C are diagrams showing certain features of a HAMR slider that does not use the techniques described herein.

FIGS. 6A, 6B, 6C, and 6D are diagrams showing certain features of a HAMR slider that includes a heat sink in accordance with some embodiments.

FIGS. 8A, 8B, 8C, 8D, and 8E are diagrams showing certain features of a HAMR slider that includes two heat sinks in accordance with some embodiments.

Figure 1:
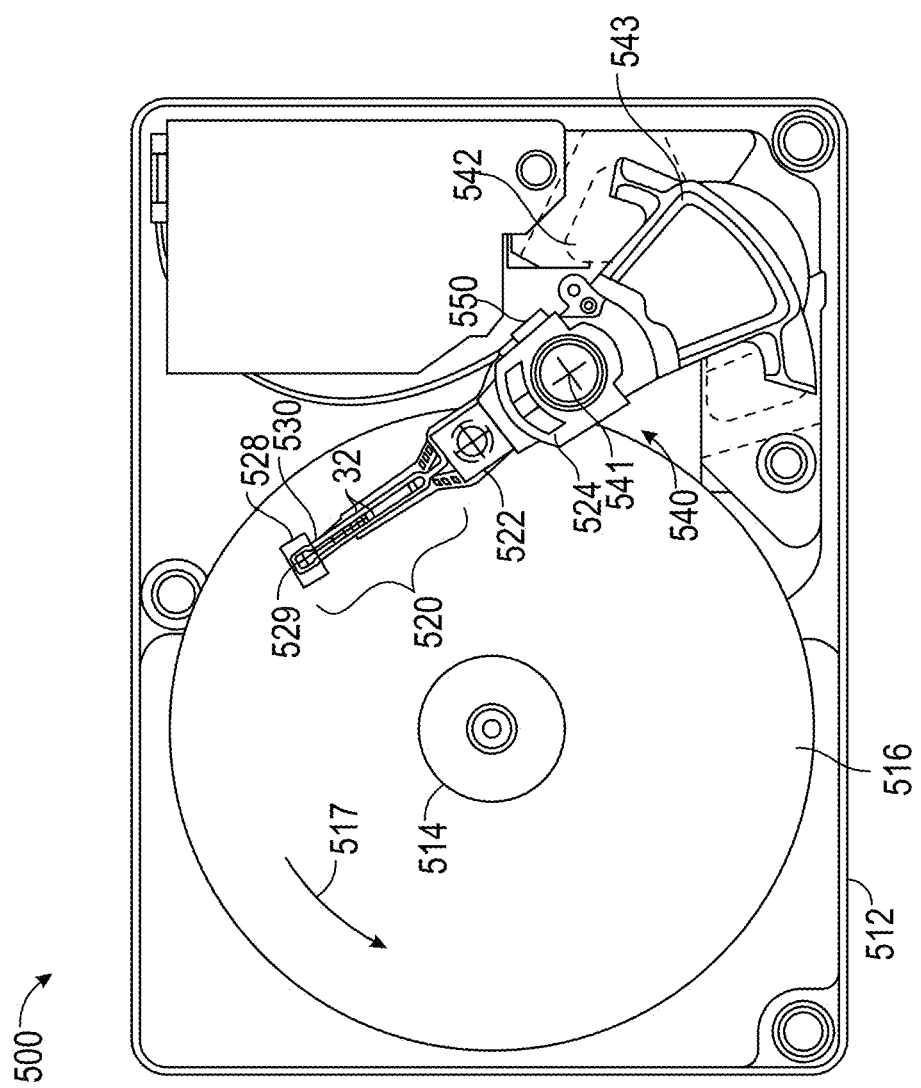
FIG. 1 is a top view of an example of a data storage device into which embodiments disclosed herein can be incorporated.

To facilitate understanding, identical reference numerals have been used, where possible, to designate identical elements that are common to the figures. It is contemplated that elements disclosed in one embodiment may be beneficially utilized in other embodiments without specific recitation. Moreover, the description of an element in the context of one drawing is applicable to other drawings illustrating that element.

DETAILED DESCRIPTION

Disclosed herein are techniques for reducing laser diode temperature variations (or swings) in HAMR devices. To mitigate increases in temperature when the laser diode is switched on for a write operation, one or more heat sinks are situated in contact with lateral surfaces of the laser diode assembly to direct heat generated in the laser cavity away from the laser diode assembly and to the slider body. The heat sinks are made of thermally conductive material, and they can be connected to the slider body by connector material (e.g., solder, silver paste, etc.). As described further below, by providing multiple heat flow paths directly connecting the laser diode assembly to the slider body, the magnitude of the temperature swing the laser diode experiences when switched on and off can be reduced, thereby reducing or eliminating mode hopping and its adverse effects. Multiple heat sinks and heat flow paths can be provided (situated in contact with other lateral surfaces of the laser diode assembly) to direct more heat away from the laser diode assembly. In the limit, all lateral surfaces of the laser diode assembly can be encapsulated by heat sinks to maximize heat sinking and minimize temperature swings due to the laser diode being switched on and off.

FIG. 1 is a top view of an example of a data storage device 500 (e.g., a HAMR data storage device or another type of data storage device) into which embodiments disclosed herein can be incorporated. FIG. 1 illustrates a head/disk assembly of the data storage device 500 with the cover removed. The data storage device 500 includes a rigid base 512 supporting a spindle 514 that supports a recording media 516 (or multiple recording media 516). The spindle 514 is rotated by a spindle motor, which, in operation, rotates the recording media 516 in the direction shown by the curved arrow 517. The data storage device 500 has at least one load beam assembly 520 having an integrated lead suspension (ILS) or flexure 530 with an array 32 of electrically conductive interconnect traces or lines. The at least one load beam assembly 520 is attached to rigid arms 522 connected to an E-shaped support structure, sometimes called an E-block 524. The flexure 530 is attached to a slider 528, which is typically formed of a composite material, such as a composite of alumina titanium carbide (Al$_2$O$_3$/TiC, sometimes abbreviated as "AlTiC").

A recording head 529 for recording to a recording media 516 is located at the end or trailing surface of the slider 528. The recording head 529 comprises a read portion for reading from the recording media 516 and a write portion for writing to the recording media 516. FIG. 1 illustrates only one recording media 516 surface with the slider 528 and recording head 529, but there may be multiple recording media 516 stacked on a hub that is rotated by the spindle motor, with a separate slider 528 and recording head 529 associated with each surface of each recording media 516.

As the recording media 516 rotates, the recording media 516 drags gas (which may be air, helium, etc.) under the slider 528 in a direction approximately parallel to the tangential velocity of the recording media 516. The slider 528 has a media-facing air-bearing surface (ABS) that causes the slider 528 to ride on a cushion or bearing of gas, typically air, mostly helium, or hydrogen, generated by rotation of the recording media 516. (It is to be understood that the term "air-bearing surface (ABS)" is used herein to refer to the gas-bearing surface of a slider, regardless of whether the gas within the drive is air or another gas (e.g., predominantly helium) or a mixture of gases.) As the air or gas passes under the slider 528 ABS, compression of the air or gas along the air flow path causes the air pressure between the recording media 516 and the slider 528 to increase, which creates a hydrodynamic lifting force that counteracts the tendency of the at least one load beam assembly 520 to push the slider 528 toward the recording media 516. The slider 528 thus flies above the recording media 516 but in close proximity to the surface of the recording media 516. The flexure 530 enables the slider 528 to "pitch" and "roll" on the air (or gas) bearing generated by the recording media 516 as it rotates. Thus, during normal operation, the recording head 529 remains slightly above the surface of the recording media 516, riding on the air bearing.

The data storage device 500 of FIG. 1 also includes a rotary actuator assembly 540 rotationally mounted to the rigid base 512 at a pivot point 541. The rotary actuator assembly 540 may include a voice coil motor (VCM) actuator that includes a magnet assembly 542 fixed to the rigid base 512 and a voice coil 543. The voice coil 543 is a coil of wire attached to the recording head 529 assembly. It is situated within the magnetic field of the magnet assembly 542. The voice coil 543 is mounted on the rotary actuator assembly 540. As the electric current varies in the voice coil 543, the resulting magnetic field interacts with the magnet assembly 542, causing a force that moves the entire rotary actuator assembly 540. The movement of the rotary actuator assembly 540 positions the recording head 529 over the desired data track on the recording media 516.

When energized by control circuitry, which may include, for example, a processor, the voice coil 543 moves and thereby rotates E-block 524 with the rigid arms 522 and the at least one load beam assembly 520 to position the recording head 529 over the data tracks on the recording media 516. As the recording media 516 rotates in the direction of the curved arrow 517 shown in FIG. 1, the movement of the rotary actuator assembly 540 allows the recording head 529 on the slider 528 to access different data tracks on the recording media 516. The process of moving the recording head 529 to the correct track is known as "seeking."

The array 32 of electrically conductive interconnect traces or lines connects at one end to the recording head 529 and at its other end to read/write circuitry contained in an electrical module or chip 550, which, in the data storage device 500 of FIG. 1, is secured to a side of the E-block 524. The chip 550 includes a read/write integrated circuit (R/W IC). The chip 550 may include a controller (e.g., as part of the R/W IC or external to it). The chip 550 may assist in the implementation of the techniques described herein.

To read information from the recording media 516, the recording head 529 may include at least one read head or read sensor. The read sensor(s) in the recording head 529 may include, for example, one or more giant magnetoresistance (GMR) sensors, tunneling magnetoresistance (TMR) sensors, or another type of magnetoresistive sensor. When the slider 528 passes over a track on the recording media 516, the recording head 529 (via the read head) detects changes in resistance due to magnetic field variations recorded on the recording media 516, which represent the recorded bits.

To write information to the recording media 516, the recording head 529 includes a write head (or write portion). In general, the write head can be any suitable write head. Some of the examples included herein describe and illustrate a HAMR head, but it is to be appreciated that the disclosed techniques are applicable to other types of recording head 529 where it is desirable to manage temperature swings.

In operation, after the voice coil 543 has positioned the recording head 529 over the data tracks on the recording media 516, the recording head 529 may be used to write information to one or more tracks on the surface of the recording media 516 and to read previously-recorded information from the tracks on the surface of the recording media 516. The tracks may comprise discrete data islands of magnetizable material (e.g., bit-patterned media), or the recording media 516 may have a conventional continuous magnetic recording layer of magnetizable material. Processing circuitry in the data storage device 500 (e.g., on the chip 550) provides to the recording head 529 signals representing information to be written to the recording media 516 and receives from the recording head 529 signals representing information read from the recording media 516.

The recording head 529 can include a HAMR device for writing to the recording media 516. Some HAMR devices use a semiconductor laser system to heat the media to lower its coercivity. A waveguide transports optical energy from the laser to the slider air-bearing surface (ABS), and a near-field transducer (NFT) concentrates the light on a tiny (e.g., nanometer-sized) spot on the media. More detailed information about the structure and functionality of a thermally assisted magnetic write head with an NFT can be found in U.S. Pat. No. 8,351,151 to Katine et al., the disclosure of which is hereby incorporated by reference in its entirety for all purposes as if fully set forth herein.

The performance of HAMR device is affected by the performance of the associated laser. Lasers (e.g., laser diodes) are typically designed to emit light at a specific wavelength and frequency, but under some conditions, they can exhibit what is known as mode hopping. Mode hopping is the sudden change in the laser's output wavelength or frequency, which can reduce the power and/or efficiency of the laser.

Mode hopping can be caused by a variety of factors. For example, fluctuations in the operating current can induce mode hopping. As another example, temperature fluctuations can cause the dimensions of the laser cavity to shift, leading to a shift in the lasing mode. To reduce mode hopping, it is desirable for laser diodes to operate within specific temperature and current ranges.

HAMR devices can exhibit mode hopping because the temperature of the laser diode can increase substantially when it is activated for write operations. Mode hopping is undesirable because changes in the power and/or efficiency of the laser can have a negative effect on the writing process (e.g., by heating the recording media 516 more or less than intended, by heating a larger or smaller area of the recording media 516 than intended, etc.).

Figure 2:
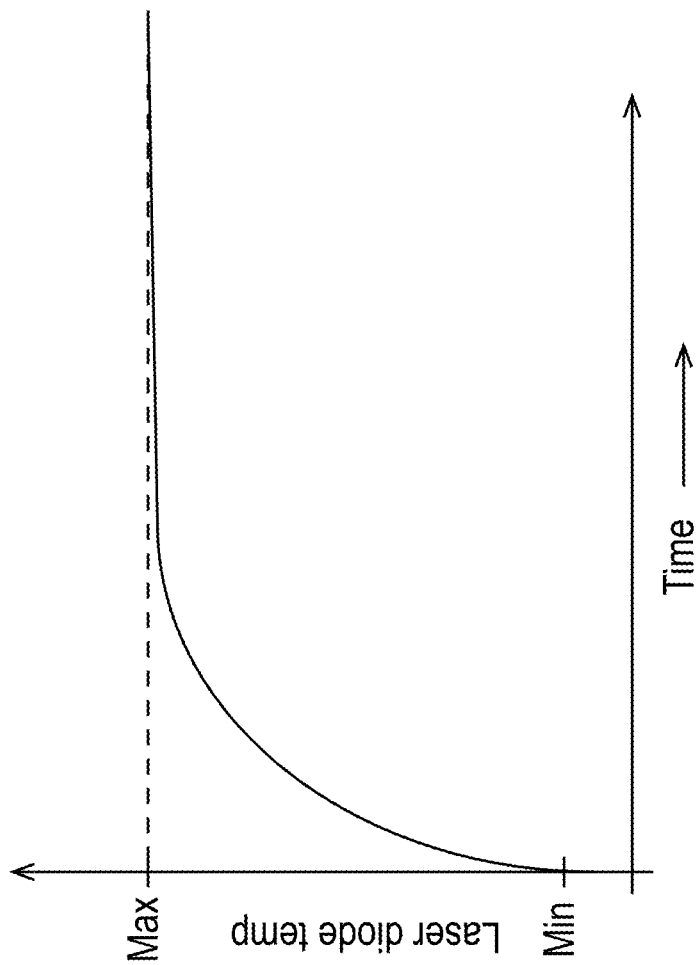
FIG. 2 is a plot showing an example of the heating cycle of an example of a HAMR laser diode for a write operation.

FIG. 2 is a plot showing an example heating cycle of a HAMR laser diode for a write operation, which illustrates that a temperature swing can be expected. After the laser diode is switched on, its temperature increases from its minimum value and stabilizes at a maximum temperature after some amount of time (e.g., tens of milliseconds). The difference between the maximum temperature ("Max") and the minimum temperature ("Min") may be significant enough to cause mode hopping. Depending on the magnitude of the temperature swing, several mode hops could occur when the laser diode is switched on.

To reduce mode hopping in laser diodes used in HAMR devices, it is desirable to reduce the temperature swing experienced by the laser diode as it operates (e.g., the difference between "Max" and "Min" in FIG. 2). Disclosed herein are techniques for doing so.

FIGS. 3A, 3B, and 3C are diagrams showing certain features of a HAMR slider that does not use the techniques described herein. FIG. 3A is a top view of a portion of the slider 528, FIG. 3B is a cross-section view of the slider 528 at the location indicated in FIG. 3A, and FIG. 3C is a side cross-section view of the slider 528 at the location indicated in FIG. 3A. Each of FIGS. 3A, 3B, and 3C includes axes of a rectangular coordinate system. In the illustrated coordinate system, the width of the slider 528 is in the x-direction, the length of the slider 528 is in the y-direction, and the back surface 104 of the slider 528 lies in an x-y plane. The trailing edge 103 of the slider 528 is in an x-z plane.

As shown in FIGS. 3A, 3B, and 3C, a submount 110 and a laser diode assembly 105 are mounted on the back surface 104 of the slider 528. The laser diode assembly 105 is attached to the submount 110 (directly or through one or more intervening components), and the submount 110 is mounted to the slider body 102 by a connector material 120A. The slider body 102 can be any suitable material, such as, for example, aluminum titanium carbide (AlTiC). For reference and to help orient the reader, FIGS. 3A, 3B, and 3C show the emission point 108 of the laser diode assembly 105 and the waveguide 180 situated in the slider 528, but it is to be appreciated that these features may not be visible in top, end, and/or side views of an implementation of the slider 528. The ABS 160 of the slider 528 is also indicated in FIGS. 3B and 3C.

As shown in FIGS. 3B and 3C, the laser diode assembly 105 (and the emission point 108) are separated from the back surface 104 by a gap 170. The gap 170 provides thermal isolation between the emission point 108 and the waveguide 180, helps to optimize optical efficiency, and reduces the likelihood of mechanical interference between the waveguide 180 and the laser diode of the laser diode assembly 105. A primary function of the submount 110 is to allow the laser diode assembly 105 to be coupled to the slider body 102 such that the gap 170 is present between the waveguide 180 and the emission point 108. Therefore, the submount 110 may be made of a material that provides a desired mechanical stability (e.g., silicon) so that the laser diode assembly 105 will be held securely in place with the emission point 108 in alignment with the waveguide 180.

Figure 4:
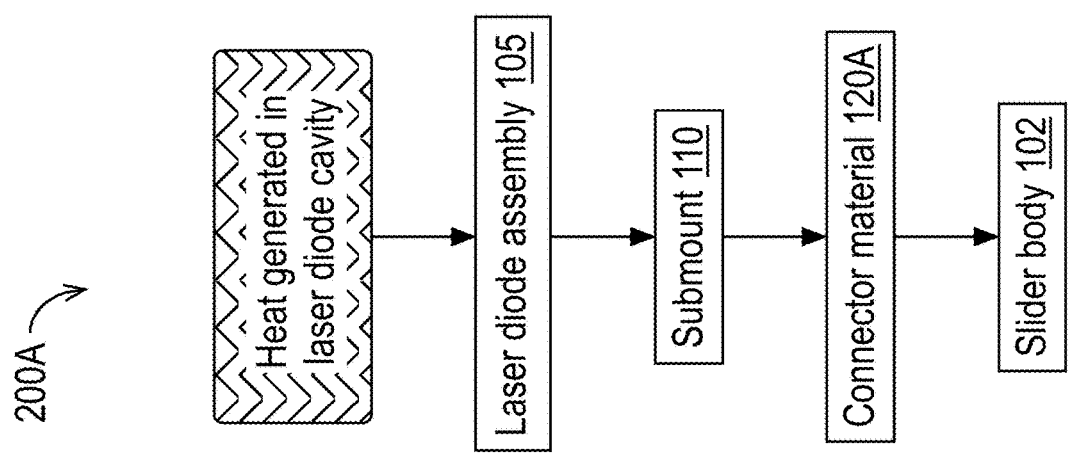
FIG. 4 is a heat flow diagram for the configuration illustrated in FIGS. 3A, 3B, and 3C.

The submount 110 may be able to direct some heat away from the laser diode assembly 105. FIGS. 3B and 3C include thick arrows representing the flow of heat from the laser diode assembly 105, through the submount 110, through the connector material 120A, and to the slider body 102. FIG. 4 is a heat flow diagram 200A for the configuration illustrated in FIGS. 3A, 3B, and 3C. As shown in FIG. 4, heat generated in the laser diode cavity flows from the laser diode assembly 105, through the submount 110, through the connector material 120A, and to the slider body 102. Thus, the submount 110 and connector material 120A perform the function of attaching the laser diode assembly 105 to the slider body 102. In addition, the submount 110 and connector material 120A perform the function of providing a first heat sinking path from the laser diode assembly 105 to the slider body 102.

Because a primary objective of the submount 110 is to hold the laser diode assembly 105 in a particular position relative to the slider body 102, the material of the submount 110 might be selected for its mechanical properties and may not be optimal from a thermal conduction standpoint. Therefore, although the submount 110 may be able to sink some of the heat generated by the laser diode assembly 105, by itself, the submount 110 likely cannot provide sufficient heat sinking to control temperature fluctuations in the laser diode assembly 105 enough to effectively mitigate or eliminate mode hopping.

The inventors had the insight that dedicated heat sinks could be situated on other, exposed lateral surfaces of the laser diode assembly 105 to direct more heat away from the laser diode assembly 105 than the submount 110 alone can. The heat sinks can be made of thermally conductive material and mounted to the slider body 102 in order to direct heat from the laser diode assembly 105 into the slider body 102.

Figure 5A:
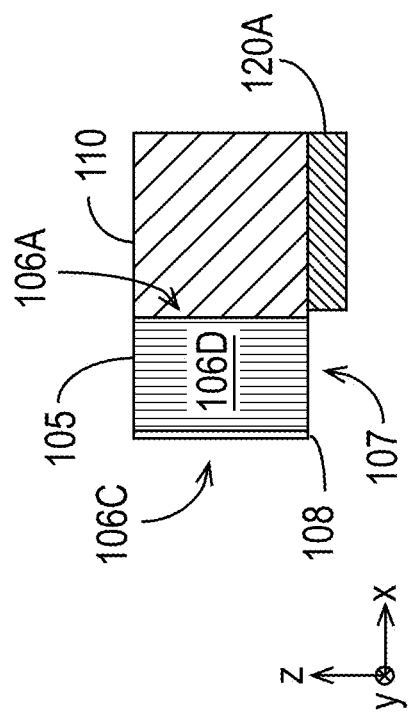
FIG. 5A is a top view of a submount and laser diode assembly, showing the lateral surfaces of the laser diode assembly in accordance with some embodiments.
Figure 5B:
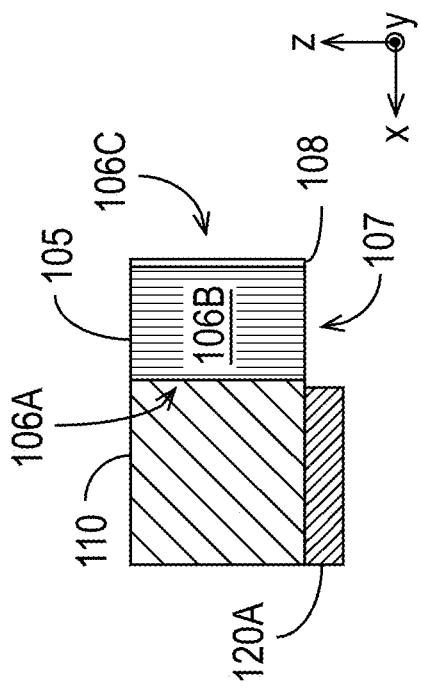
FIG. 5B is a cross-section view of the submount, laser diode assembly, and connector material at the position indicated in FIG. 5A in accordance with some embodiments.
Figure 5C:
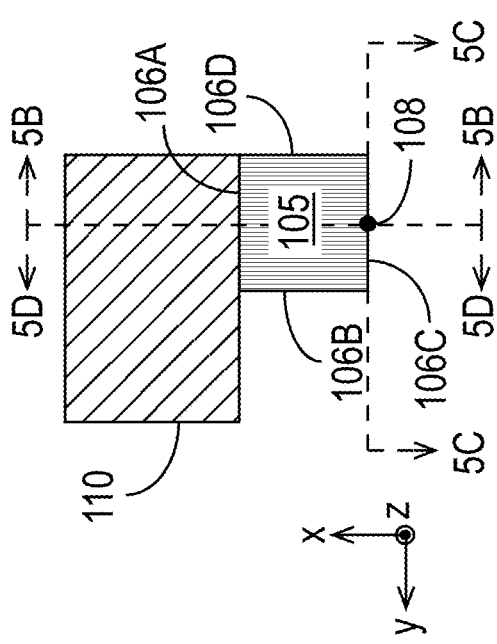
FIG. 5C is a side view of the submount, laser diode assembly, and connector material at the position indicated in FIG. 5A in accordance with some embodiments.
Figure 5D:
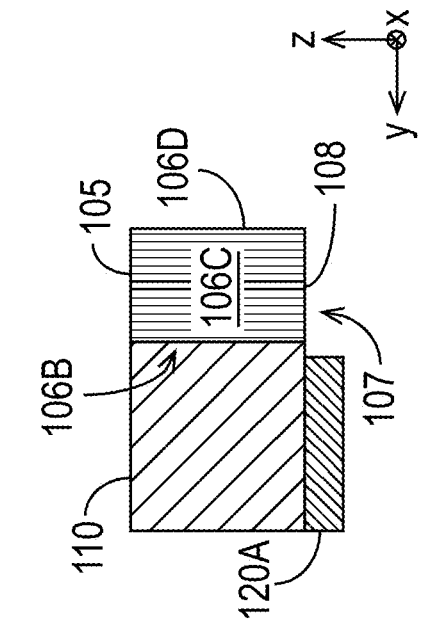
FIG. 5D is a cross-section view of the submount, laser diode assembly, and connector material at the position indicated in FIG. 5A in accordance with some embodiments.

Before describing the techniques in detail, the lateral surfaces and slider-facing surface of the laser diode assembly 105 are identified. FIG. 5A is a top view of a submount 110 and laser diode assembly 105, identifying the lateral surfaces of the laser diode assembly 105 in accordance with some embodiments. FIG. 5B is a cross-section view of the submount 110, laser diode assembly 105, and connector material 120A at the position indicated in FIG. 5A in accordance with some embodiments. FIG. 5C is a side view of the submount 110, laser diode assembly 105, and connector material 120A at the position indicated in FIG. 5A in accordance with some embodiments. FIG. 5D is a cross-section view of the submount 110, laser diode assembly 105, and connector material 120A at the position indicated in FIG. 5A in accordance with some embodiments. The reference coordinates are included in FIGS. 5A, 5B, 5C, and 5D to help orient the reader.

As illustrated, the lateral surface 106A of the laser diode assembly 105 is mounted (connected) to the submount 110. The lateral surface 106D faces the trailing edge of the slider 528, and the lateral surface 106B faces the leading edge. The lateral surface 106C is on the opposite side of the laser diode assembly 105 relative to the lateral surface 106A and the submount 110. The laser diode assembly 105 also includes a waveguide-facing surface 107 that faces the slider body 102 and is separated from the slider body 102 by the gap 170. (The slider body 102 is not illustrated in FIGS. 5A, 5B, 5C, and 5D to avoid obscuring the drawings, but its location is clear by reference to FIGS. 3A, 3B, and 3C.)

FIGS. 6A, 6B, 6C, and 6D are diagrams showing certain features of a HAMR apparatus, namely a slider, that includes a heat sink 130A in accordance with some embodiments. FIG. 6A is a top view of a portion of the slider 528A. FIG. 6B is a top "exploded" view of the heat sink 130A and the laser diode assembly 105 from FIG. 6A with the lateral surfaces of the heat sink 130A and laser diode assembly 105 labeled. FIG. 6C and FIG. 6D are cross-section views of the slider 528A at the locations indicated in FIG. 6A. Each of FIGS. 6A, 6B, 6C, and 6D includes axes of the same rectangular coordinate system used in other drawings herein. With reference to FIG. 6B, the lateral surface 106A, lateral surface 106B, lateral surface 106C, and lateral surface 106D of the laser diode assembly 105 are as described above in the context of FIGS. 5A-5C.

In the example illustrated in FIGS. 6A-6D, the heat sink 130A has a substantially cuboid shape. As illustrated in FIG. 6B, the heat sink 130A has a lateral surface 131A, a lateral surface 131B, a lateral surface 131C, and a lateral surface 131D. As shown in FIGS. 6A, 6C, and 6D, the heat sink 130A is in contact with the laser diode assembly 105 (e.g., via soldering). Specifically, the lateral surface 131D of the heat sink 130A is in contact with the lateral surface 106B of the laser diode assembly 105. As in the example of FIGS. 3A-3C, in FIGS. 6A-6D the submount 110 is attached to the slider body 102 by the connector material 120A, and the lateral surface 106A of the laser diode assembly 105 is in contact with the submount 110 (e.g., the lateral surface 106A is mounted to the submount 110). In addition, in the example illustrated in FIGS. 6A-6D, the lateral surface 106B of the laser diode assembly 105 is in contact with the lateral surface 131D of the heat sink 130A, the heat sink 130A is in contact with connector material 120B, and the connector material 120B is in contact with the slider body 102.

Because the lateral surface 131D of the heat sink 130A is in contact with the lateral surface 106B of the laser diode assembly 105, the heat sink 130A provides a portion of a second path to direct heat away from the laser diode assembly 105. Heat from the laser diode assembly 105 passes directly through the heat sink 130A, through the connector material 120B, and to the slider body 102.

In some embodiments, the lateral surface 131D of the heat sink 130A is at least as large as the lateral surface 106B of the laser diode assembly 105. In other words, the area of the lateral surface 131D is greater than or equal to the area of the lateral surface 106B. In the example illustrated in FIGS. 6A-6D, the lateral surface 131D of the heat sink 130A is in contact with (covers) the entirety of the lateral surface 106B of the laser diode assembly 105, thereby providing a large surface area and volume for efficient heat transfer. Accordingly, when designing the heat sink 130A, at least one dimension of the heat sink 130A can be selected based at least in part on the size (e.g., a dimension) of the laser diode assembly 105. For example, one or more dimensions of the heat sink 130A (e.g., its height in the z-direction, its width in the x-direction, etc.) can be selected so that when the heat sink 130A is in place, the lateral surface 131D of the heat sink 130A covers the entirety of the lateral surface 106B of the laser diode assembly 105.

The heat sink 130A may be in contact with the submount 110 (e.g., as shown in FIG. 6A), or the heat sink 130A and the submount 110 may be separated from each other (e.g., there may be a gap between the heat sink 130A and the submount 110).

The heat sink 130A can be made of any suitable thermally conductive material. For example, the heat sink 130A can be made of one or more of: silicon, aluminum, copper, an aluminum alloy, a copper-aluminum composite, graphite, or another thermally conductive material. In some embodiments, the heat sink 130A and the submount 110 are made from the same material (e.g., silicon). In some embodiments, the heat sink 130A is made from a different material than the submount 110. In some embodiments, the material of the heat sink 130A is lightweight so as not to have a significant effect on the weight and/or flying characteristics of the slider 528A.

In some embodiments, the thermal conductivity of the heat sink 130A is greater than or equal to the thermal conductivity of a material of the slider body 102. For example, the thermal conductivity of the heat sink 130A may be greater than or equal to the thermal conductivity of the laser diode assembly 105. In some embodiments, the thermal conductivity of the heat sink 130A is at least 50 watts per meter-kelvin (W/(m·K)).

In some embodiments, the thermal conductivity of the heat sink 130A is at least as high as the thermal conductivity of the submount 110 (e.g., the heat sink 130A provides a second heat transfer path from the laser diode assembly 105 that is at least as thermally conductive as the heat transfer path through the submount 110). In some embodiments, the thermal conductivity of the heat sink 130A is greater than the thermal conductivity of the submount 110 (e.g., the heat sink 130A provides a more thermally conductive heat transfer path than does the submount 110).

The heat sink 130A is coupled to the slider body 102 by a connector material 120B. The connector material 120B can be physically distinct from the connector material 120A used to couple the submount 110 to the slider body 102, or the connector material 120A and the connector material 120B can be a continuous, monolithic material (e.g., created using a single solder flow).

Together, the heat sink 130A and connector material 120B perform the function of providing a second heat sinking path from the laser diode assembly 105 to the slider body 102. In some embodiments, the second heat sinking path is in addition to the first heat sinking path from the laser diode assembly 105, through the submount 110 and connector material 120A, and to the slider body 102. The connector material 120B can be any material or mechanism suitable for coupling the heat sink 130A to the slider body 102. For example, the connector material 120B can be solder or silver paste.

The materials used for the heat sink 130A and/or the connector material 120B can be selected based at least in part on the thermal conductivities of those materials. For example, the material for the heat sink 130A and/or the material for the connector material 120B can be selected so that at least a portion of the heat flow path from the laser diode assembly 105 to the slider body 102 through the heat sink 130A and the connector material 120B has a thermal conductivity (e.g., a minimum or average thermal conductivity) that is at least a specified value (e.g., at least as large as the thermal conductivity of the submount 110 and/or the slider body 102, some specified number of watts per meter-kelvin (W/(m·K), etc.).

As shown by the thick arrows in FIGS. 6A-6D, and with reference to FIGS. 3A-3C, the addition of the heat sink 130A provides a second path for heat transfer from the laser diode assembly 105 to the slider body 102. Specifically, in addition to the heat flow path 201A described above in the discussion of FIGS. 3A-3C, the slider 528A of FIGS. 6A-6D includes a second heat flow path from the laser diode assembly 105, through the heat sink 130A, through the connector material 120B, and to the slider body 102.

It is to be appreciated that although FIGS. 6A-6D illustrate the submount 110 and the heat sink 130A as separate physical components, they can be implemented as a single (integrated, monolithic) component that is in contact with two lateral surfaces of the laser diode assembly 105 to allow the heat sink 130A portion of the integrated component to provide a second heat flow path away from the laser diode assembly 105.

Figure 7:
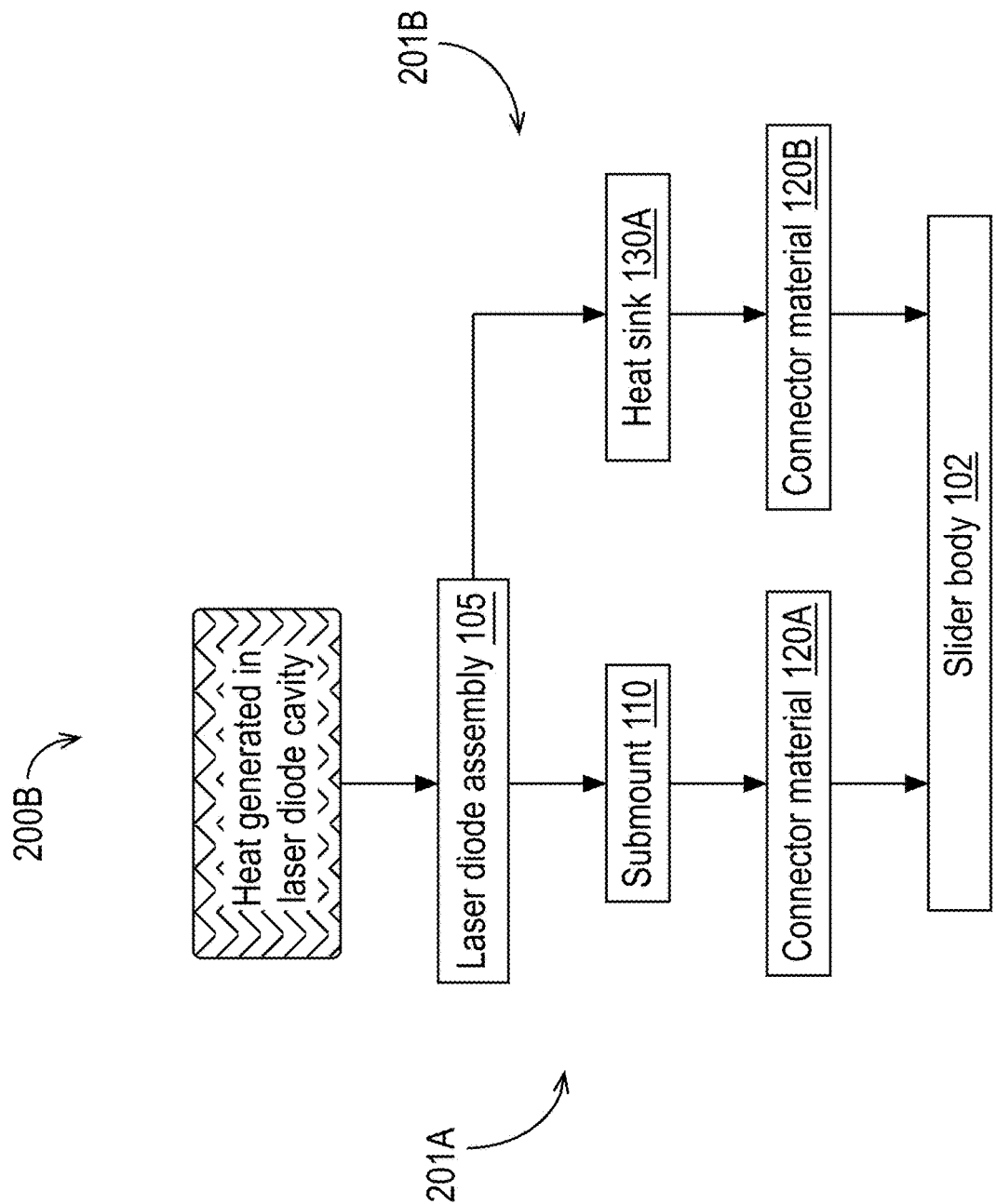
FIG. 7 is a heat flow diagram for the example configuration illustrated in FIGS. 6A, 6B, 6C, and 6D in accordance with some embodiments.

FIG. 7 is a heat flow diagram 200B for the example configuration illustrated in FIGS. 6A, 6B, 6C, and 6D in accordance with some embodiments. As shown in FIG. 7, in addition to the heat flow path 201A described above in the discussion of FIG. 4, the heat flow diagram 200B includes the heat flow path 201B, whereby heat generated in the laser diode cavity flows from the laser diode assembly 105, through the heat sink 130A, through the connector material 120B, and to the slider body 102.

Figure 8B:
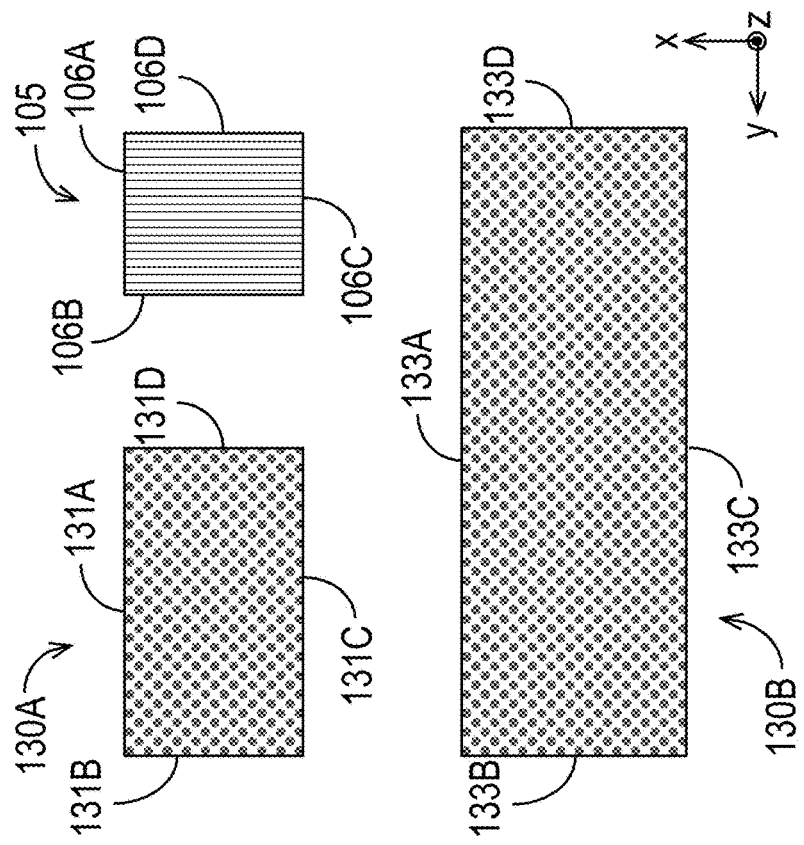
Figure 8A:
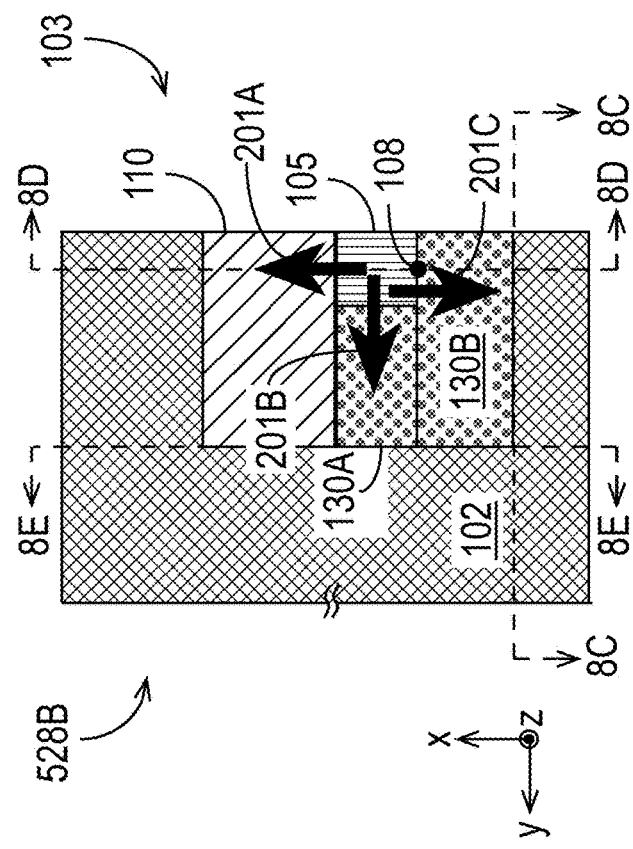

A slider 528 can include more than one heat sink. FIGS. 8A, 8B, 8C, 8D, and 8E are diagrams showing certain features of a HAMR slider that includes two heat sinks in accordance with some embodiments. FIG. 8A is a top view of a portion of the slider 528B. FIG. 8B is a top "exploded" view of the heat sink 130A, the heat sink 130B, and the laser diode assembly 105 from FIG. 8A with the lateral surfaces of the heat sink 130A, the heat sink 130B, and the laser diode assembly 105 labeled. FIGS. 8C, 8D, and 8E are cross-section views of the slider 528B at the locations indicated in FIG. 8A. Each of FIGS. 8A-8E includes axes of the same rectangular coordinate system shown in other drawings herein.

Like the slider 528A shown in FIGS. 6A-6D, the slider 528B includes a heat sink 130A in contact with the lateral surface 106B of the laser diode assembly 105. The heat sink 130A shown in FIGS. 8A-8E was described above in the discussion of FIGS. 6A-6D. That description applies to FIGS. 8A-8E and is not repeated here. In addition to the heat sink 130A, the slider 528B includes a heat sink 130B.

In the slider 528B of FIGS. 8A-8E, each of the heat sink 130A and the heat sink 130B has a substantially cuboid shape. As illustrated in FIG. 8B, the lateral surface 106A, lateral surface 106B, lateral surface 106C, and lateral surface 106D of the laser diode assembly 105 are as described above in the context of FIGS. 5A-5D, and the lateral surface 131A, lateral surface 131B, lateral surface 131C, and lateral surface 131D of the heat sink 130A are as described above in the context of FIGS. 6A-6D. The heat sink 130B has a lateral surface 133A, a lateral surface 133B, a lateral surface 133C, and a lateral surface 133D. As shown in FIGS. 8A, 8C, 8D, and 8E, the heat sink 130B is in contact with both the laser diode assembly 105 and the heat sink 130A (e.g., via solder). Specifically, the lateral surface 133A of the heat sink 130A is in contact with the lateral surface 106C of the laser diode assembly 105 and the lateral surface 131C of the heat sink 130A.

In the example illustrated in FIGS. 8A-8E, the submount 110 is attached to the slider body 102 by the connector material 120A, the lateral surface 106A of the laser diode assembly 105 is in contact with the submount 110 (e.g., the lateral surface 106A is mounted to the submount 110), the lateral surface 106B of the laser diode assembly 105 is in contact with the lateral surface 106B of the heat sink 130A, the heat sink 130A is in contact with the connector material 120B, and the connector material 120B is in contact with the slider body 102. In addition, the lateral surface 133A of the heat sink 130B is in contact with the lateral surface 106C of the laser diode assembly 105 and the lateral surface 131C of the heat sink 130A. The heat sink 130B is in contact with the connector material 120C, and the connector material 120C is in contact with the slider body 102.

In some embodiments, the lateral surface 133A of the heat sink 130B is at least as large as the lateral surface 106C of the laser diode assembly 105. In other words, the area of the lateral surface 133A is greater than or equal to the area of the lateral surface 106C. In the example illustrated in FIGS. 8A-8E, the lateral surface 133A of the heat sink 130B is in contact with (covers) the entirety of the lateral surface 106C of the laser diode assembly 105, thereby providing a large surface for efficient heat transfer. Accordingly, when designing the heat sink 130B, at least one dimension of the heat sink 130B can be selected based at least in part on the size (e.g., a dimension) of the laser diode assembly 105. For example, one or more dimensions of the heat sink 130B (e.g., its height in the z-direction, its width in the x-direction, etc.) can be selected so that when the heat sink 130B is in place, the lateral surface 133A of the heat sink 130B covers the entirety of the lateral surface 106C of the laser diode assembly 105. The design of the heat sink 130B can also take into account the size of the heat sink 130A (e.g., so that the lateral surface 133A also covers the lateral surface 131C when the heat sink 130B is in place).

The heat sink 130B can be made of any suitable thermally conductive material. For example, the heat sink 130B can be made of one or more of: silicon, aluminum, copper, an aluminum alloy, a copper-aluminum composite, graphite, or another thermally conductive material. In some embodiments, the heat sink 130B is made from a different material from one or both of the heat sink 130A and the submount 110. In some embodiments, the material of the heat sink 130B is lightweight so as not to have a significant effect on the weight and/or flying characteristics of the slider 528B.

In some embodiments, the thermal conductivity of the heat sink 130B is greater than or equal to the thermal conductivity of a material of the slider body 102. For example, the thermal conductivity of the heat sink 130B may be greater than or equal to the thermal conductivity of the laser diode assembly 105. In some embodiments, the thermal conductivity of the heat sink 130B is at least 50 watts per meter-kelvin (W/(m·K)).

In some embodiments, the thermal conductivity of the heat sink 130B is at least as high as the thermal conductivity of the submount 110 and/or the heat sink 130A (e.g., the heat sink 130B provides a third heat transfer path from the laser diode assembly 105 that is at least as thermally conductive as the heat transfer path through the submount 110 and/or the heat transfer path through the heat sink 130A). In some embodiments, the thermal conductivity of the heat sink 130B is greater than the thermal conductivity of the submount 110 and/or the heat sink 130A (e.g., the heat sink 130B provides a more thermally conductive heat transfer path than does the submount 110 and/or the heat sink 130A).

The heat sink 130B is coupled to the slider body 102 by a connector material 120C. The connector material 120C can be any material or mechanism suitable for coupling the heat sink 130B to the slider body 102. For example, the connector material 120C can be solder or silver paste.

Together, the heat sink 130B and connector material 120C perform the function of providing a third heat sinking path from the laser diode assembly 105 to the slider body 102. In some embodiments, the third heat sinking path is in addition to the first heat sinking path from the laser diode assembly 105, through the submount 110 and connector material 120A, and to the slider body 102, and in addition to the second heat sinking path from the laser diode assembly 105, through the heat sink 130A and connector material 120B, and to the slider body 102. At least a portion of the third heat sinking path is different from the second heat sinking path (e.g., from the laser diode assembly 105, through the heat sink 130A and the connector material 120B, and to the slider body 102). For example, in the case that the connector material 120B and the connector material 120C are physically indistinguishable (e.g., implemented by the same solder flow), the third heat sinking path is through the heat sink 130B, whereas the second heat sinking path is through the heat sink 130A.

Because the heat sink 130B is in contact with the lateral surface 106C of the laser diode assembly 105, it provides an additional direct, effective path to direct heat away from the laser diode assembly 105. The thermal conductivity of the heat sink 130B can be the same as the thermal conductivity of the heat sink 130A, or it can be different.

The heat sink 130B is illustrated in FIGS. 8A and 8E as being in contact with the heat sink 130A, but this is not a requirement. Conversely, although the heat sink 130A and heat sink 130B are illustrated as separate and distinct components, they may be implemented as a single, monolithic component (e.g., in the view of FIG. 8A, having an "L" shape).

The materials used for the heat sink 130A, the heat sink 130B, the connector material 120B, and/or the connector material 120C can be selected based at least in part on the thermal conductivities of those materials. For example, the material for the heat sink 130A and the material for the connector material 120B can be selected so that at least a portion of the heat flow path from the laser diode assembly 105 to the slider body 102 through the heat sink 130A and the connector material 120B has a thermal conductivity (e.g., a minimum or average thermal conductivity) that is at least a specified value. Similarly, the material for the heat sink 130B and the material for the connector material 120C can be selected so that at least a portion of the heat flow path from the laser diode assembly 105 to the slider body 102 through the heat sink 130B and the connector material 120C has a thermal conductivity (e.g., a minimum or average thermal conductivity) that is at least a specified value (e.g., at least as large as the thermal conductivity of the submount 110 and/or the slider body 102, some specified number of watts per meter-kelvin (W/(m·K), etc.), which may be the same as or different from the thermal conductivity (e.g., minimum, average, etc.) of the heat flow path through the heat sink 130A and the connector material 120B.

The connector material 120C can be physically distinct from the connector material 120A used to couple the submount 110 to the slider body 102, or the connector material 120A and the connector material 120C can be a continuous, monolithic material (e.g., created using a single solder flow). Similarly, the connector material 120C can be physically distinct from the connector material 120B used to couple the heat sink 130A to the slider body 102, or the connector material 120C and the connector material 120B can be a continuous, monolithic material (e.g., created using a single solder flow). All three of the connector material 120A, connector material 120B, and connector material 120C can be a continuous, monolithic material (e.g., created using a single solder flow).

As shown in the example of FIGS. 8A-8E, the heat sink 130B may be in contact with the heat sink 130A. Alternatively, the heat sink 130B and the heat sink 130A may be separated from each other. Similarly, in a different arrangement, the heat sink 130B can be in contact with the submount 110. As in the example of FIGS. 8A-8E, the heat sink 130B and the submount 110 may be separated from each other.

As shown by the thick arrows in FIGS. 8A, 8C, 8D, and 8E, and with reference to FIGS. 3A-3C and FIGS. 6A-6D, the addition of the heat sink 130B provides a third path for heat transfer from the laser diode assembly 105 to the slider body 102. Specifically, in addition to the heat flow path 201A described above in the discussion of FIGS. 3A-3C and the heat flow path 201B described above in the discussion of FIGS. 6A-6D and FIG. 7, the slider 528B of FIGS. 8A-8E includes a third heat flow path from the laser diode assembly 105, through the heat sink 130B, through the connector material 120C, and to the slider body 102.

Figure 9:
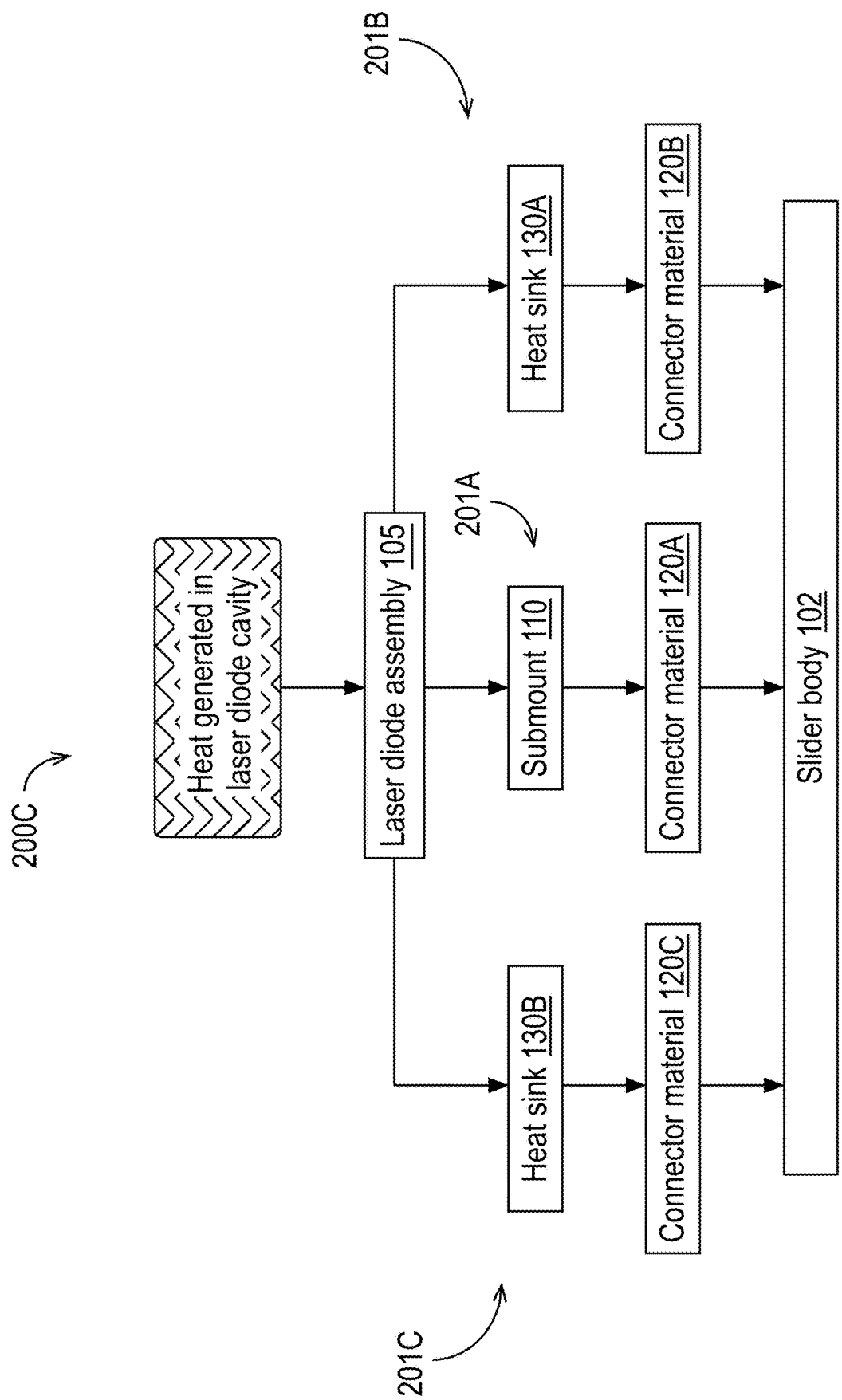
FIG. 9 is a heat flow diagram for the example configuration illustrated in FIGS. 8A, 8B, 8C, 8D, and 8E in accordance with some embodiments.

FIG. 9 is a heat flow diagram 200C for the example configuration illustrated in FIGS. 8A-8E in accordance with some embodiments. As shown in FIG. 9, in addition to the heat flow path 201A described above in the discussion of FIG. 4 and the heat flow path 201B described above in the discussion of FIG. 7, the heat flow diagram 200C includes the heat flow path 201C, whereby heat generated in the laser diode cavity flows from the laser diode assembly 105, through the heat sink 130B, through the connector material 120C, and to the slider body 102.

It is to be appreciated that although FIGS. 8A-8E illustrate the submount 110, the heat sink 130A, and the heat sink 130B as separate physical components, they can be implemented as a single (integrated, monolithic) component that is in contact with three lateral surfaces of the laser diode assembly 105 to allow the heat sink 130A and heat sink 130B portions of the integrated component to provide second and third heat flow paths between the laser diode assembly 105 and the slider body 102.

In addition, the drawings herein illustrate the submount 110, the laser diode assembly 105, the heat sink 130A and/or the heat sink 130B in particular positions relative to each other, but it is to be appreciated that the illustrated configurations are only examples. Other arrangements are possible.

Moreover, although FIGS. 8A-8E illustrate an example of a slider 528 with two heat sinks (heat sink 130A and heat sink 130B), it is to be appreciated that an implementation can include more than two heat sinks. For example, it may be possible in some designs for all four lateral sides of the laser diode assembly 105 to be in contact with heat sinks (e.g., the laser diode assembly 105 can be encapsulated by the submount 110 and heat sinks (e.g., heat sink 130A, heat sink 130B, and/or additional heat sinks). Thus, depending on the design of the slider 528, a fourth heat sink in contact with the fourth lateral surface of the laser diode assembly 105 (the lateral surface 106D) and a fourth connector material could be included to provide a fourth heat flow path between the laser diode assembly 105 and the slider body 102.

It will be appreciated that one advantage of the techniques disclosed herein is that at least one lateral surface of the laser diode assembly 105 is in contact with at least one heat sink (e.g., heat sink 130A, heat sink 130B, etc.), which, along with the connector material (e.g., connector material 120A and/or connector material 120B and/or connector material 120C) provides a path for heat transfer from the laser diode assembly 105 to the slider body 102. Any configuration in which the entirety of at least one lateral surface of the laser diode assembly 105 is in contact with at least one heat sink is contemplated.

Individually, heat sink 130A and heat sink 130B examples shown herein have a substantially cuboid shape, but it is to be appreciated that other shapes are possible. For example, as explained herein, when the laser diode assembly 105 has a substantially cuboid shape, the heat sink 130A and heat sink 130B can be implemented as an integrated component that, in the backside view of a slider 528, would have an "L" shape (e.g., see FIG. 8A). Similarly, in embodiments in which the submount 110, the heat sink 130A, and the heat sink 130B are made from the same material (e.g., silicon), and the laser diode assembly 105 has a substantially cuboid shape, the submount 110, the heat sink 130A, and the heat sink 130B can be implemented as an integrated component that, in the backside view of a slider 528, would have a "C" shape (e.g., see FIG. 8A). In embodiments in which the laser diode assembly 105 has a substantially cuboid shape and is encapsulated by heat sinks, the shape of the submount 110, the heat sink 130A, the heat sink 130B, and at least one additional heat sink would have be substantially "O" shaped.

As explained above, the connector material 120A, connector material 120B, and/or connector material 120C can be solder or silver paste. It is to be appreciated that these are merely examples, and there are other possibilities. For example, the connector material 120A, connector material 120B, and/or connector material 120C could be any thermally conductive structure capable of holding the submount 110, heat sink 130A, and/or heat sink 130B in place.

Figure 10:
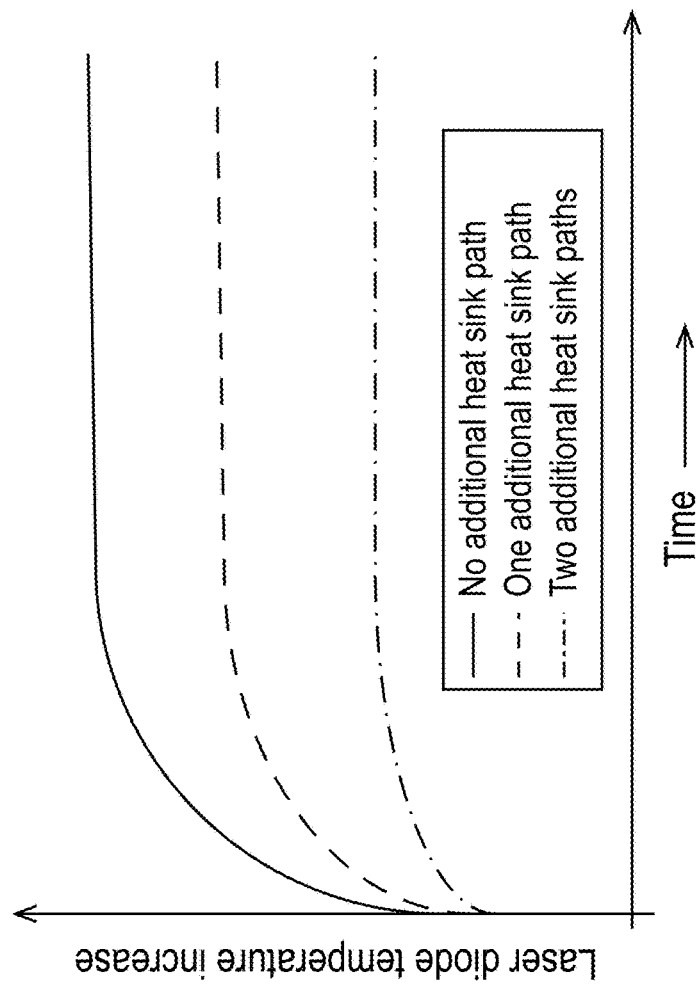
FIG. 10 illustrates the effect of the heat sinks on the observed temperature increase of the laser diode assembly in accordance with some embodiments.

FIG. 10 illustrates the effect of including the heat sink 130A and/or the heat sink 130B on the observed temperature increase of the laser diode assembly 105 in accordance with some embodiments. The solid line represents the temperature increase of the laser diode assembly 105 that results when the laser diode is switched on in a HAMR device, and the only heat sinking is through the submount 110 and connector material 120A. The dashed curve represents the temperature increase that results when the laser diode is switched on, and one additional heat flow path is provided (e.g., the heat flow path 201A comprising the heat sink 130A and connector material 120B as shown in the example of FIGS. 6A-6D), and the dash-dot curve represents the temperature increase that results when the laser diode is switched on, and two additional heat flow paths are provided (e.g., the heat flow path 201A comprising the heat sink 130A and the connector material 120B, and the heat flow path 201B comprising the heat sink 130B and connector material 120C, as shown in the example of FIGS. 8A-8E). As FIG. 10 shows, adding the heat flow path 201B reduces the temperature increase experienced by the laser diode, and adding both the heat flow path 201B and the heat flow path 201C reduces the temperature increase even more.

Figure 11:
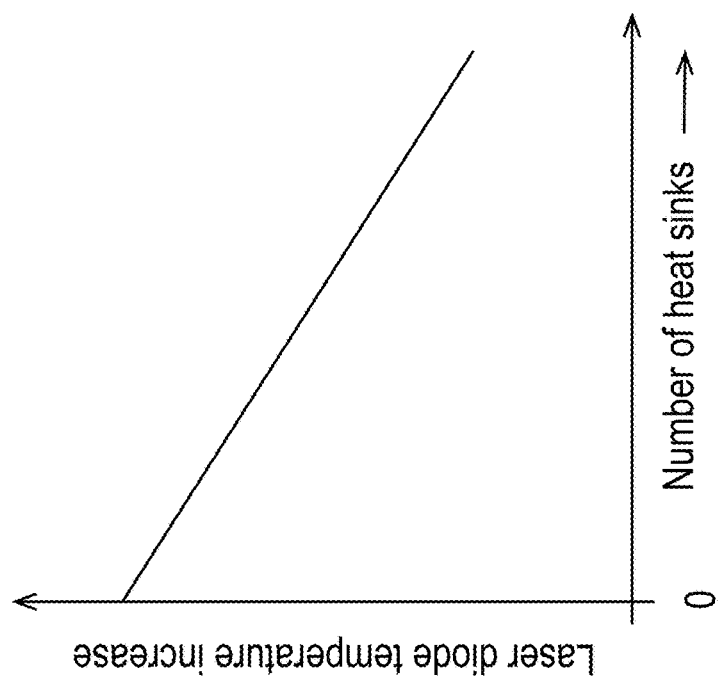
FIG. 11 illustrates the general trend of the laser diode temperature increase as a function of number of heat sinks in accordance with some embodiments.

As FIG. 10 suggests, generally speaking, the more heat sinks (and heat flow paths) that are provided, the lower the temperature increase that is experienced by the laser diode when it is switched on. FIG. 11 illustrates the general trend in accordance with some embodiments. As shown in FIG. 11, the magnitude of the temperature increase is inversely proportional to the number of heat sinks (and heat flow paths) provided. Thus, FIG. 11 indicates that providing additional heat sinks can reduce the temperature increase experienced by the laser diode when it is switched on for writing operations, which can mitigate or eliminate mode hops.

Figure 12:
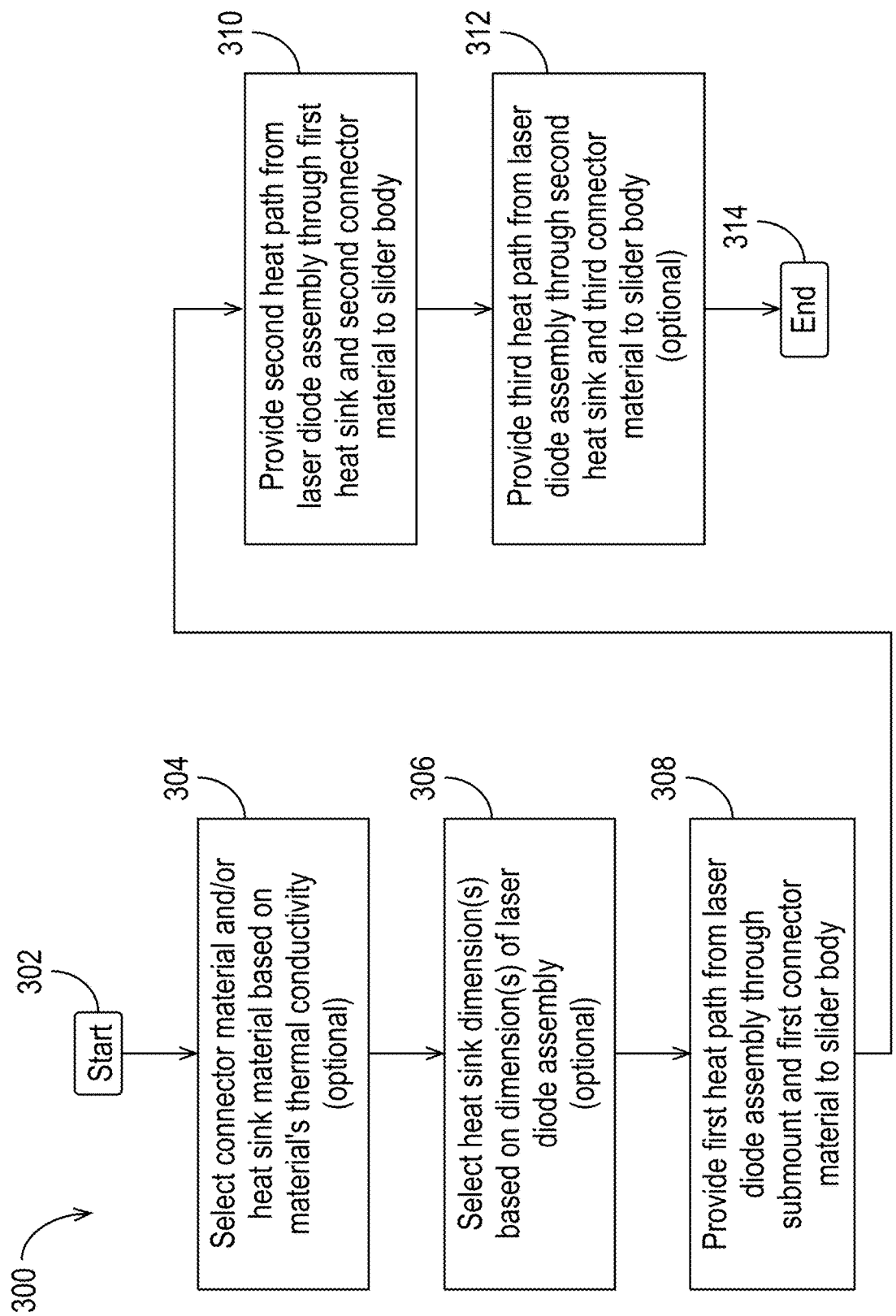
FIG. 12 is a flow diagram illustrating a method of reducing the temperature of a laser diode assembly of a HAMR device of a data storage device in accordance with some embodiments.

FIG. 12 is a flow diagram illustrating a method 300 of reducing the temperature of a laser diode assembly 105 of a HAMR device of a data storage device 500 in accordance with some embodiments. At block 302, the method 300 begins. At block 304, optionally, a material is selected for the connector material 120B, connector material 120C, material for the heat sink 130A, and/or material for the heat sink 130B (e.g., depending on whether the heat sink 130B is included). The material can be selected based at least in part on the thermal conductivity of the material. The material for the heat sink 130A and/or heat sink 130B can be, for example, one or more of: silicon, aluminum, copper, an aluminum alloy, a copper-aluminum composite, graphite, or another thermally conductive material. The material for the connector material 120B and/or connector material 120C can be, for example, solder, silver paste, or any other suitable connector material.

At block 306, optionally, a dimension of the heat sink 130A and/or heat sink 130B is selected based at least in part on a dimension of the laser diode assembly 105. For example, as explained above, the size of the heat sink 130A and/or the heat sink 130B can be selected so that the area of the lateral surface 131D is greater than or equal to the area of the lateral surface 106B of the laser diode assembly 105, and/or the area of the lateral surface 133A is greater than or equal to the area of the lateral surface 106C of the laser diode assembly 105. One or more of the dimensions of the heat sink 130A and the heat sink 130B can be selected in this way so that when the heat sink 130A and/or the heat sink 130B is in position on the slider 528, at least one lateral surface of the laser diode assembly 105 (e.g., lateral surface 106B, lateral surface 106C, etc.) is completely (entirely, fully) covered by a lateral surface of the heat sink 130A or heat sink 130B (e.g., the entire area of a particular lateral surface of the laser diode assembly 105 is in contact with/covered by the heat sink 130A or heat sink 130B).

At block 308, a first heat flow path (e.g., heat flow path 201A) is provided from the laser diode assembly 105. The first heat flow path is configured to direct heat from the laser diode assembly 105 through the submount 110, through first connector material (e.g., connector material 120A), and to the slider body 102.

At block 310, a second heat flow path (e.g., heat flow path 201B) is provided from the laser diode assembly 105. The second heat flow path is configured to direct heat from the laser diode assembly 105 through a first heat sink (e.g., heat sink 130A), through a second connector material (e.g., connector material 120B), and to the slider body 102.

At block 312, optionally, a third heat path (e.g., heat flow path 201C) is provided from the laser diode assembly 105. The third heat flow path directs heat from the laser diode assembly 105 through a second heat sink (e.g., heat sink 130B), through a third connector material (e.g., connector material 120C), and to the slider body 102. At block 314, the method 300 ends.

It is to be appreciated that solder or a similar mechanism can be used to place the heat sink 130A and/or heat sink 130B in contact with the laser diode assembly 105. In other words, there can be an adhesive/joining material between the laser diode assembly 105 and the lateral surface(s) of the heat sink 130A and/or heat sink 130B. Accordingly, the heat flow path 201B comprises the heat sink 130A and the connector material 120B but could also include other material(s) used to create the physical path between the laser diode assembly 105 and the slider body 102. Similarly, the heat flow path 201C comprises the heat sink 130B and the connector material 120C but could also include other material(s) used to create the physical path between the laser diode assembly 105 and the slider body 102.

It is to be appreciated that although the drawings herein illustrate the laser diode assembly 105 as substantially cuboid, the laser diode assembly 105 could have a different shape. In such cases, one or more heat sinks can be designed to be situated in contact with some or all of the lateral surfaces of the laser diode assembly 105. In general, the teachings herein can be applied to provide heat sinks that fit against one or more lateral surfaces of a laser diode assembly 105 that has an arbitrary size and shape.

It is also to be appreciated that although this disclosure describes the HAMR light source as a laser or laser diode, the techniques are not limited to any particular HAMR implementation. In general, the techniques can be applied to any component or combination of components for any implementation in which it is desirable to sink heat generated during HAMR operations.

In the foregoing description and in the accompanying drawings, specific terminology has been set forth to provide a thorough understanding of the disclosed embodiments. In some instances, the terminology or drawings may imply specific details that are not required to practice the invention.

To avoid obscuring the present disclosure unnecessarily, well-known components are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used in the specification and the appended claims, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to."

The terms "exemplary" and "embodiment" are used to express examples, not preferences or requirements.

The term "coupled" is used herein to express a direct connection/attachment as well as a connection/attachment through one or more intervening elements or structures.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The term "substantially" is used to describe a structure, configuration, dimension, etc. that is largely or nearly as stated, but, due to manufacturing tolerances and the like, may in practice result in a situation in which the structure, configuration, dimension, etc. is not always or necessarily precisely as stated. For example, describing two lengths as "substantially equal" means that the two lengths are the same for all practical purposes, but they may not (and need not) be precisely equal at sufficiently small scales. As another example, a structure that is "substantially vertical" would be considered to be vertical for all practical purposes, even if it is not precisely at 90 degrees relative to horizontal.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

The invention claimed is:

1. A heat-assisted magnetic recording (HAMR) apparatus for writing to a magnetic storage media, the HAMR apparatus comprising:
    a slider body;
    a submount;
    a laser diode assembly comprising a plurality of lateral surfaces and a waveguide-facing surface; and
    a first heat sink;
    wherein:
    the submount is attached to the slider body by a first connector material;
    a first lateral surface of the laser diode assembly is mounted to the submount;
    a second lateral surface of the laser diode assembly is in contact with a first lateral surface of the first heat sink;
    the first heat sink is in contact with a second connector material; and
    the second connector material is in contact with the slider body.

2. The HAMR apparatus recited in claim 1, wherein the first heat sink is substantially cuboid.

3. The HAMR apparatus recited in claim 1, wherein an area of the first lateral surface of the first heat sink is greater than or equal to an area of the second lateral surface of the laser diode assembly.

4. The HAMR apparatus recited in claim 3, wherein the first lateral surface of the first heat sink is in contact with an entirety of the second lateral surface of the laser diode assembly.

5. The HAMR apparatus recited in claim 1, wherein a thermal conductivity of the first heat sink is greater than or equal to a thermal conductivity of the laser diode assembly.

6. The HAMR apparatus recited in claim 1, wherein a thermal conductivity of the first heat sink is greater than a thermal conductivity of the submount.

7. The HAMR apparatus recited in claim 1, further comprising:
    a second heat sink,
    wherein:
    a third lateral surface of the laser diode assembly is in contact with a first lateral surface of the second heat sink;
    the second heat sink is in contact with a third connector material; and
    the third connector material is in in contact with the slider body.

8. The HAMR apparatus recited in claim 7, wherein the second heat sink is substantially cuboid.

9. The HAMR apparatus recited in claim 7, wherein an area of the first lateral surface of the second heat sink is greater than or equal to an area of the third lateral surface of the laser diode assembly.

10. The HAMR apparatus recited in claim 9, wherein the first lateral surface of the first heat sink is in contact with an entirety of the second lateral surface of the laser diode assembly.

11. The HAMR apparatus recited in claim 7, wherein the first lateral surface of the second heat sink is in contact with a second surface of the first heat sink.

12. A HAMR recording device comprising the HAMR apparatus recited in claim 1.

13. A method of directing heat away from a laser diode assembly of a heat-assisted magnetic recording (HAMR) device, the method comprising:
providing a first heat path from the laser diode assembly, the first heat path directing heat from a first lateral surface of the laser diode assembly through a submount, through a first connector material, and to a slider body; and
providing a second heat path from the laser diode assembly, the second heat path directing the heat from a second lateral surface of the laser diode assembly through a first heat sink, through a second connector material, and to the slider body.

14. The method of claim 13, further comprising:
selecting at least one dimension of the first heat sink based at least in part on a dimension of the laser diode assembly.

15. The method of claim 13, further comprising:
selecting at least one of the second connector material or a material of the first heat sink based at least in part on a thermal conductivity of the second connector material or the material of the first heat sink.

16. The method of claim 15, wherein a thermal conductivity of the first heat sink is greater than a thermal conductivity of the submount.

17. The method of claim 15, wherein a thermal conductivity of at least a portion of the first heat path or the second heat path is greater than or equal to a thermal conductivity of the laser diode assembly.

18. The method of claim 13, further comprising:
providing a third heat path from the laser diode assembly, the third heat path directing the heat from a third lateral surface of the laser diode assembly through a second heat sink, through a third connector material, and to the slider body.

19. The method of claim 18, further comprising:
selecting at least one of the second connector material, the third connector material, a material of the first heat sink, or a material of the second heat sink based at least in part on a conductivity of the second connector material, the third connector material, the material of the first heat sink, or the material of the second heat sink.

20. A heat-assisted magnetic recording (HAMR) data storage device, comprising:
means for attaching a laser diode assembly to a slider body; and
means for providing a heat sinking path directly from the laser diode assembly to the slider body, wherein at least a portion of the heat sinking path is distinct from the means for attaching the laser diode assembly to the slider body, and wherein the means for providing the heat sinking path directly from the laser diode assembly to the slider body are in direct contact with the laser diode assembly.

21. The HAMR data storage device recited in claim 20, wherein the heat sinking path is a first heat sinking path, and further comprising:
means for providing a second heat sinking path directly from the laser diode assembly to the slider body, wherein at least a portion of the second heat sinking path is distinct from the first heat sinking path.

* * * * *